United States Patent [19]

Martin et al.

[11] Patent Number: 5,721,088
[45] Date of Patent: Feb. 24, 1998

[54] ELECTRODEPOSITABLE PHOTOIMAGEABLE COMPOSITIONS WITH IMPROVED EDGE COVERAGE

[75] Inventors: James W. Martin, Bethel Park Township, Allegheny County; Charles F. Kahle, II, McCandless Township, Allegheny County, both of Pa.

[73] Assignee: PPG Industries, Inc., Pittsburgh, Pa.

[21] Appl. No.: 580,017

[22] Filed: Dec. 20, 1995

[51] Int. Cl.$^6$ .................. G03F 7/039; G03F 7/004
[52] U.S. Cl. .................. 430/270.1; 430/138; 430/935; 430/280.1; 430/285.1; 430/281.1; 204/478
[58] Field of Search .................. 430/270.1, 280.1, 430/285.1, 281.1, 138, 935; 204/478

[56] References Cited

U.S. PATENT DOCUMENTS

| | | | |
|---|---|---|---|
| 4,039,414 | 8/1977 | McGinniss | 204/181 |
| 4,067,791 | 1/1978 | Konno et al. | 204/159.15 |
| 4,081,343 | 3/1978 | Schimmel et al. | 204/181 C |
| 4,414,278 | 11/1983 | Cohen et al. | 428/402 |
| 4,533,445 | 8/1985 | Orio | 430/284.1 X |
| 4,544,623 | 10/1985 | Audykowski et al. | 430/280.1 |
| 4,592,816 | 6/1986 | Emmons et al. | 204/180.6 |
| 4,632,900 | 12/1986 | Demmer et al. | 430/323 |
| 4,681,923 | 7/1987 | Demmer et al. | 204/478 X |
| 4,753,865 | 6/1988 | Fryd et al. | 430/281.1 |
| 4,755,551 | 7/1988 | Nakano et al. | 524/430 |
| 4,869,796 | 9/1989 | Kanda et al. | 204/181.6 |
| 4,877,818 | 10/1989 | Emmons et al. | 522/26 |
| 4,970,135 | 11/1990 | Kushi et al. | 430/280.1 |
| 5,096,556 | 3/1992 | Corrigan et al. | 204/181.7 |
| 5,102,775 | 4/1992 | Okuhara et al. | 430/287.1 |
| 5,171,655 | 12/1992 | Aoshima | 430/138 |
| 5,181,984 | 1/1993 | Matsumura et al. | 156/630 |
| 5,230,984 | 7/1993 | Tachiki et al. | 430/270.1 |
| 5,344,744 | 9/1994 | Ueda et al. | 430/287.1 |
| 5,403,698 | 4/1995 | Tachiki et al. | 430/286.1 |

FOREIGN PATENT DOCUMENTS

| | | | |
|---|---|---|---|
| 81471/91 | 2/1992 | Australia | 430/281 |
| 539 714A1 | 9/1992 | European Pat. Off. . | |
| 568 827 A2 | 4/1993 | European Pat. Off. . | |
| 3174432 | 7/1991 | Japan . | |
| 6073314 | 3/1994 | Japan . | |

OTHER PUBLICATIONS

Surface Coatings, Chapter 28 Extended Pigments, pp. 344 thru 351 (no date given).

*Primary Examiner*—Cynthia Hamilton
*Attorney, Agent, or Firm*—Paul S. Chirgott

[57] ABSTRACT

This invention provides an improved electrodepositable photoimageable resist composition which includes a photosensitive composition and a microgel. The photosensitive composition can be either a negative-acting or a positive-acting photoresist. Moreover, with regard to each of these, the photoresist component can be either cationic or anionic. The microgel includes a plurality of crosslinked organic particles which can form a stable aqueous dispersion. Moreover, the microgel is present in an amount ranging from between about 0.1 to about 30 weight percent. These weight percentages are based upon the total weight of the resin solids in the photoimageable resist composition. At these concentrations, the microgels promote edge coverage, but do not significantly reduce the photosensitivity and developability properties of the photosensitive composition with which they are combined.

7 Claims, No Drawings

ELECTRODEPOSITABLE PHOTOIMAGEABLE COMPOSITIONS WITH IMPROVED EDGE COVERAGE

FIELD OF THE INVENTION

The present invention relates to electrodepositable photoimageable compositions (hereinafter referred to as "photoresists"). Particularly, the present invention relates to such compositions which are especially suitable for use in the manufacture of circuit patterns having conductive through-holes.

BRIEF DESCRIPTION OF THE PRIOR ART

Processes for forming resist patterns on the surfaces of substrates are known in the art. Such processes typically comprise forming a photosensitive layer onto the surface of a substrate, irradiating portions of the photosensitive layer with actinic light, and developing the irradiated layer. If the solubilization of the photoresist increases when exposed to actinic light, it is referred to in the industry as a "positive-acting" photoresist. On the other hand, if the solubilization of the photoresist decreases (i.e., if the photoresist crosslinks) when exposed to the actinic light, it is referred to in the industry as a "negative-acting" photoresist.

In most instances, a photoresist is used to protect the underlying substrate from the effects of a subsequent etching process. Defects in the resist pattern, such as inadequate coverage over certain parts of the substrate or inadequate development of the irradiated layer, can result in an incomplete or shorted circuit. Accordingly, it is important to employ a photoresist whose irradiated layer can adequately be developed and form a uniform layer over all surfaces of the substrate to be protected.

The importance of employing such a photoresist becomes even more critical when it is used to form high density circuit boards. High density boards typically have circuit patterns on their surfaces which are interconnected at predetermined locations. Such an interconnection is often accomplished by the passage of a circuit through precisely positioned conductively coated holes (hereinafter referred to as "through-holes") which pass through the substrate.

Since the electrodeposition processes form smooth, uniform films on substrates, particularly those having three dimensional features, it is often the preferred method for applying photoresists onto substrates having conductive through-holes. There are, however, problems associated with the electrodeposition of photoresists onto such substrates. For example, conventional electrodeposited photoresists tend to flow away from the edges of conductive through-holes. This phenomenon can result in the formation of a very thin film, if any, of the photoresist around these edges. As such, the edges of the through-holes can be prone to attack by etchants during subsequent processing procedures. This may, in turn, result in the formation of an incomplete circuit.

One method of trying to resolve this problem is set out in U.S. Pat. No. 4,755,551 which discloses a six-step process for preparing a printed circuit board having a plated through-hole design. In that process, a resist layer is formed on the surface of a copper-plated substrate which has conductive through-holes. This resist layer has a pattern which is opposite to that of the desired circuit (i.e., a reverse pattern). In accordance with U.S. Pat. No. 4,755,551, the resist layer is not electrodeposited onto the substrate. This resist layer is also not permitted to enter into any of the substrate's through-holes. After the resist layer is applied onto the substrate, a resinous paint layer is electrodeposited onto the exposed areas (i.e., onto those portions of the plated layer not covered by the resist). This resinous paint contains an inorganic filler to promote edge coverage. Thereafter, the resinous paint layer is cured.

According to U.S. Pat. No. 4,755,551, the resinous paint layer is applied in such a manner that it flows into the substrate's through-holes. It should be noted, however, that this resinous paint is not photoimageable (i.e., it is not a photoresist). Accordingly, U.S. Pat. No. 4,755,551 uses a non-photoimageable resinous paint to protect the edges of conductive through-holes. Although U.S. Pat. No. 4,755,551 discloses that the process can be used to form printed circuit boards with conductive through-holes, it requires the use of: (a) a photoresist, (b) a non-photoimageable, electrodepositable resinous paint, (c) a photoresist layer removing agent, and (d) a resinous paint layer removing agent.

As the need for higher density and higher precision circuit boards continues to grow, so does the need for improved methods of producing such boards. This includes a need for the development of improved electrodepositable photoresists.

SUMMARY OF THE INVENTION

Accordingly, one object of the present invention is to provide an improved photoresist composition containing a component which promotes edge coverage but does not significantly affect the photoresist's photosensitivity and developability properties.

Another objective of this invention is to provide an improved method of producing printed circuit boards with conductive through-holes.

The objects of this invention are achieved through the development of an improved electrodepositable photoimageable resist composition. The photoimageable resist composition includes a photoresist component and a microgel component. The photoresist component can be either negative-acting or positive-acting. Moreover, with regard to each of these embodiments, the photoresist component can be either cationic or avionic.

The microgel component of the improved photoimageable resist composition made in accordance with the present invention promotes edge coverage of the resist composition. Surprisingly, however, the microgel component does not significantly reduce the photosensitivity and developability properties of the photoresist component with which they are combined. The properties of the improved photoimageable resist composition made in accordance with the present invention makes it especially useful in the preparation of high density circuit boards that have a conductive through-hole design.

These and other aspects and advantages of this invention will become apparent to those skilled in the art upon reading the following Detailed Description.

DETAILED DESCRIPTION OF THE INVENTION

As used herein, the term "photosensitivity" refers to the light exposure dosage necessary to insolubilize a negative-acting photoresist or solubilize a positive-acting photoresist. For example, as a photoresist's photosensitivity increases, the dosage of actinic light needed to insolubilize or solubilize a film made therefrom decreases, and vice versa. The unit of measurement used herein to quantify light exposure dosages is millijoules per square centimeter ($mJ/cm^2$).

As used herein, the term "developability" refers to the susceptibility of an exposed positive-acting photoresist or unexposed negative-acting photoresist to be removed or washed away by a developing solution.

The improved electrodepositable photoresist can be either positive-acting or negative-acting. Moreover, with regards to each of these photoresists, they can also be either anionic or cationic.

Notwithstanding the above, when practicing this invention to produce a printed circuit made from copper or a copper alloy, it is preferred to use cationic photoresists, regardless of whether the photoresist is positive-acting or negative-acting. This preference is due, in part, to the fact that anionic solutions have a tendency react with copper more so than their cationic counterparts. This reaction can adversely affect the integrity of the resulting circuit board.

Moreover, it is also preferred to use positive-acting photoresists for preparing circuit boards having a conductive through-hole design. This preference is due, in part, to the difficulty encountered when attempting to insolubilize, and subsequently remove, a negative-acting photoresist located within the through-holes. On the other hand, positive-acting photoresists do not require light to perform their protective function during an etching process.

Microgel as Edge Coverage Promoter

The microgels which can be used when practicing this invention are typically stabilized cationic or anionic aqueous dispersions of crosslinked polymer particles. The microgel may be any polymer which can be crosslinked, and which can form a stable aqueous dispersion. Moreover, the microgels' ionic orientation should coincide with the ionic orientation of the photoresist into which they are incorporated. Accordingly, since it is presently preferred to employ cationic photoresists, the preferred microgel is also cationic.

In one preferred embodiment of this invention, cationic microgels are prepared by mixing a cationic polyepoxide-amine reaction product and a polyepoxide crosslinking agent: This mixture is then heated to a temperature sufficient to crosslink the mixture and form a cationic microgel. Preferably, the cationic polyepoxide-amine reaction product and polyepoxide crosslinking agent are dispersed in a reaction medium such as water. The resulting microgel dispersion can then be combined with electrodepositable photoresists.

The resin solids content of a cationic microgel dispersion which can be used when practicing this invention is typically from between about 5 to 40 percent by weight. The dispersions at this solids content have good storage stability. The particle size of such a cationic microgel dispersion is typically from between about 500 to 2,000 angstroms with the particle size being determined by light scattering techniques.

When made in accordance with the aforementioned process, cationic microgels can be recovered from the aqueous dispersions as dried products by solvent evaporation, spray drying or the like. The dried product can then be redispersed or used as such.

Cationic microgel dispersion prepared as described above can be used as is (i.e., in a dispersion form, and simply combined with an aqueous dispersion of an ungelled cationic electrodepositable resin to form an aqueous resinous dispersion suitable for use in cationic electrodeposition). Alternately, such cationic microgels can be recovered from the dispersion such as by azeotropic distillation, spray drying or the like and then combined with the ungelled cationic electrodepositable resin.

Examples of cationically stabilized aqueous dispersions of microgels which can be used when practicing this invention, and processes for making the same, are disclosed in U.S. Pat. No. 5,096,556, incorporated herein by reference.

In accordance with this invention, the amount of microgel employed in the photoresist should be such that it promotes edge coverage but does not adversely affect the photosensitivity and/or developability properties of the photoresist. Typically, the microgels are present in an amount ranging from between about 0.1 to about 30 weight percent. In most instances, however, the microgels are present in an amount ranging from between about 0.3 to about 25 weight percent, preferably, from between about 0.5 to about 20 weight percent, and more preferably, from between about 1 to about 15 weight percent. All of the aforementioned weight percentages are based upon the total weight of resin solids in the aqueous resinous dispersion. Although amounts greater than 30 weight percent can be employed, at that concentration, the microgels begin to interfere with the developability properties of the photoresist.

The microgel can be incorporated into the photoresist composition either before, during, or after the photoresist polymers are dispersed in water. Preferably, the microgel is combined with into the photoresist polymer before the polymer mixture is dispersed in water.

Positive-Acting Photoresists

Positive-acting photoresists into which microgels can be added are those which become more soluble in a developing solution after being exposed to actinic radiation. A number of materials, or mixtures of materials, are known to have these properties. Examples of such positive-acting photoresists include: the polyoxymethylene polymers described in U.S. Pat. No. 3,991,003, the o-nitrocarbinol esters described in U.S. Pat. No. 3,849,137, the o-nitrophenyl acetals, their polyesters, and end-capped derivatives described in U.S. Pat. No. 4,086,210, and the benzo- and naphthquinonediazide sulfonic esters described in U.S. Pat. No. 4,306,010 and British Patent Specification Nos. 1,227,602, 1,329,888 and 1,330,932.

In one preferred embodiment, the positive-acting, electrodepositable photoresist is synthesized from monomers including:

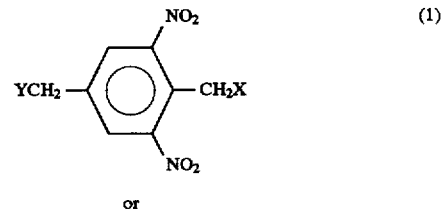

(1)

or

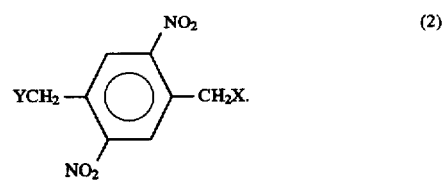

(2)

where X and Y may be the same or different members selected from the group consisting of: a halogen, —OH, —OR, —O—SO$_2$R, —SR, and —NRR', and where R and R' may be hydrogen or an organic substituent such as substituted or unsubstituted alkyl, aryl, or aralkyl substituents.

To form adducts or polymers, the R or R' groups include a reactive group. One example of such a reactive group is a hydroxyl group. After exposure to actinic radiation, the bond is broken between the carbon atom and the X component of the $CH_2X$ group. This provides the photoactivity of the positive-acting photoresist.

The 2,6-dinitro-1,4-bis(dichloromethyl)benzene species of structure (1) has been found to be particularly useful when practicing this invention. Moreover, the corresponding diol species can be derived from the dichloro monomer. Both the chloride and hydroxyl groups are reactive with a wide variety of substances whereby intermediates and polymers can be synthesized from the dichloro or diol monomers of structure (1) or from the corresponding 2,5-dinitro monomers. The oligomers or polymers thus formed are highly photoreactive, and include the photoreactive groups as defined above and at least one ether, ester, urethane, carbonate, thio, or amino group or combinations thereof. Each of these substituents may include a reactive group (e.g., OH) to enable further reaction or copolymerization, if desired.

The polymers described above can be prepared from monomers and intermediates having the defined bis (chloromethyl)dinitrobenzene or dinitrobenzene dimethanol structures. These structures are hydrolytically and thermally stable to the processing conditions encountered in photoimaging processes. Polymers such as polyurethanes, polyacrylates, polysulfides, and polyethers can be produced, and are known to be stable in electrocoating baths. Polyesters, polyamines, and polyquaternized amine polymers have also been prepared with the desirable dinitro groups set out above.

In order that the positive-acting photoresists may be electrodeposited onto the metallic substrate, they should either have salt-forming groups as part of their composition or be blended with another polymer that has salt-forming groups. Examples of salt-forming groups which can be born onto either a positive-acting photoresist or a polymer blended therewith, and which are especially useful when practicing this invention include: amine groups, carboxylic acid groups, sulphonic acid groups, phosphoric acid groups, and mixtures thereof.

Processes of preparing salts of the amine group-containing materials and of the acid group-containing materials are known. Examples of such processes include those described in U.S. Pat. No. 4,632,900, incorporated herein by reference. Moreover, examples of processes for preparing a photosensitive o-nitrophenyl acetal composition, a photosensitive o-nitrocarbinol ester of an unsaturated acid, a photosensitive quinone diazide group-containing salt, as well as other electrodepositable, positive-acting photoresists, include those described in U.S. Pat. No. 4,632, 900, also incorporated herein by reference.

Examples of positive-acting, electrodepositable photoresists which can be used when practicing this invention include those compositions which comprise the 2,6-dinitro-1,4-bis(benzyl)benzene analog (1) contained within a polymer composition. Particularly preferred positive-acting, electrodepositable photoresists include those compositions which comprise: (a) a polymeric material which contains a salt, and (b) a nonionic, positive-acting, photreactive polymer which contains the structure (1), especially where X and/or Y have a carbamate/urethane functionality.

Preferably, the salt-containing material is a cationic, acid neutralized, amine functional polymer. Examples of such polymers include: epoxies, polyurethanes, polyacrylates, polyesters, and any other polymeric materials capable of carrying a positively-charged group (e.g., a polyurethane which contains an amino group).

Polyurethanes which can be used when practicing this invention include those which are prepared from isocyanates and from materials which are reactive with isocyanates. The isocyanates can be any of those which are known to persons skilled in the art. Examples of isocyanates which can be used include: isophorone diisocyanate, and aliphatic isocyanates such as alkylene isocyanates (e.g., trimethylene, tetramethylene, pentamethylene, hexamethylene, 1,2-propylene, 1,2-butylene, 2,3-butylene, 1,3-butylene, ethylidene and butylidene diisocyanates), cycloalkylene isocyanates (e.g., 1,3-cyclopentane, 1,4-cyclohexane, 1,2-cyclohexane diisocyanates), aromatic isocyanates such as arylene isocyanates (e.g., m-phenylene, p-phenylene, 4,4'-diphenyl, 1,5-naphthalene and 1,4-naphthalene diisocyanates), alkarylene isocyanates (e.g., 4,4'-diphenyl methane, 2,4- or 2,6-tolylene, or mixtures thereof, 4,4'-toluidine, and 1,3- or 1,4-xylylene diisocyanates such as meta- or para-tetramethylxylene diisocyanate), and nuclear-substituted aromatic compounds (e.g., dianisidine diisocyanate, 4,4'-diphenylether diisocyanate and chlorodiphenylene diisocyanate).

Triisocyanates, tetraisocyanates and polymerized isocyanates can also be used. Examples of triisocyanates include: triphenyl methane-4,4',4"-triisocyanate, 1,3,5-triisocyanato benzene and 2,4,6-triisocyanato toluene. Examples of tetraisocyanates include: 4,4'-diphenyldimethyl methane-2,2', 5,5'-tetraisocyanate. Examples of polymerized polyisocyanates include: tolylene diisocyanate dimers and trimers.

Materials which can react with an isocyanate group include those which are capable of extending the polymer and increasing the molecular weight of the polyurethane. Also suitable materials are polyglycidyl ethers of polyhydric alcohols. These may be derived from polyhydric alcohols such as: ethylene glycol, diethylene glycol, triethylene glycol, 1,2-propylene glycol, 1,3-propanediol, 1,4-butylene glycol, 1,5-pentanediol, 1,6-hexandiol, 1,2,6-hexanetriol, glycerol, bis(4-hydroxycyclohexyl)2,2-propane, cyclohexyl-1,4-dimethylol, Esterdiol 204, 2,2,4-trimethylpentanediol, trimethylolpropane, erythritol and mixtures thereof.

An isocyanate terminated or hydroxyl terminated prepolymer polyurethane of predetermined molecular weight can be prepared by controlling the ratios of alcohol groups to isocyanate groups. If the prepolymer is hydroxyl terminated, it can be capped with a monoisocyanate or other alcohol protecting groups. If the prepolymer is isocyanate terminated, it can be end-capped or terminated with a variety of functionalities including: monoalcohols, primary amino groups or secondary amino groups. Particularly useful when practicing this invention are monohydric alcohols such as: aliphatic alcohols (e.g., methanol, ethanol, propanol, isopropanol, butanol, isobutyl alcohol, tert-butyl alcohol), glycol monoethers (e.g., ethylene glycol alkyl ethers, 2-butoxyethanol and 2-(2-butoxyethoxy)ethanol), fatty alcohols (e.g., stearyl alcohol, tridecyl alcohol), aromatic alcohols (e.g., benzyl alcohol), and mixtures thereof. Examples of other capping groups which can be used include oximes and acetoacetates.

The molecular weight ranges for these salt-containing polymers typically ranges from between about 1,000 to about 1,000,000. Preferably, their molecular weight ranges from between about 2,000 to about 500,000, more preferably, from between about 3,000 to about 100,000, and even more preferably, from between about 5,000 to about 50,000.

The amines which are useful for attachment onto the polyurethane backbone so as to render the polymer water dispersible in aqueous acid, preferably contain a functionality which is capable of reaction with an isocyanate (e.g., hydroxyl, amine, thiol, and the like). Examples of such amines include: N-methyldiethanolamine, 3-diethylamino-1,2-propanediol, 3-morpholino-1,2-propanediol, N,N-dimethylaminopropylamine, 1,4-bis(hydroxyethyl) piperazine, the diketimine formed by condensation of methylisobutylketone and diethylenetriamine or triethylenetetramine and mixtures thereof.

The amine-functional salt-containing polymeric material is at least partially neutralized with an acid, preferably in the presence of water. Examples of such neutralizing acids include: lactic, acetic, formic, sulfuric, phosphoric, propionic, hydroxy acetic, acrylic, methacrylic, glycolic, butyric, dimethylol propionic, 1.2 hydroxy stearic, and mixtures thereof. The neutralized material can be dispersed in water either during or after the neutralization.

The nonionic, positive-acting, photoreactive polymer which can be used when practicing this invention can be any polymer capable of having the photoreactive moiety (1) as part of its polymer chain. For example, the monomer (1), where X and/or Y is a hydroxyl group, can be easily converted into a urethane by reaction with an isocyanate. If the diol (1), where X and Y is a hydroxyl group, is used alone or as part of a mixture of other reactive species (e.g., diols, with a di- or triisocyanate), a polyurethane can be obtained therefrom.

By controlling the ratios of reagents, the molecular weight of this polymer can be controlled so as to range from between about 300 to about 1,000,000, preferably, from between about 400 to about 500,000, and more preferably, from between about 500 to about 100,000. The function of this nonionic, positive-acting, photoreactive polymer in the photoresist is to act in the following manner when exposed to actinic light: (a) to photodegrade to lower the molecular weight of the photoresist composition, and (b) to generate an amine.

Blends of the ionic polymer and the nonionic photoreactive polymer are made so to provide adequate aqueous dispersion characteristics, while retaining adequate photoresist processing characteristics (e.g. low exposure dosage, clean development without attack of the unexposed photoresist, resistance to etchants, and the ability to be stripped from the board and from the barrels of the through holes with a developing solution). Ratios of ionic to nonionic polymer which are particularly useful when practicing this invention typically range from between about 5:95 to about 95:5, preferably, from between about 10:90 to about 90:10, more preferably, from between about 20:80 to about 80:20, and even more preferably, from between about 30:70 to about 70:30.

Other examples of positive-acting, electrodepositable photoresists which can be used when practicing this invention include those described in copending U.S. application Ser. No. 08/274,614, entitled "Positive Photoactive Compounds Based on 2,6-Dinitro Benzyl Groups" and filed on July 13, 1994.

Negative-Acting Photoresists

Negative-acting photoresists into which microgels can be added in accordance with this invention, typically contains a photoinitiator. Preferred examples of negative-acting photoresists which can be used when practicing this invention include those which comprise: (a) an unsaturated, ionic polymeric material, (b) a nonionic unsaturated material, and (c) a photoinitiator.

The unsaturated, ionic polymeric component is preferably a cationic, acid-neutralized, unsaturated amine-functional polymeric material. One example of such a polymeric material is an unsaturated epoxy-amine adduct. The epoxy materials useful in making this component can be monomeric or polymeric compounds or a mixture of compounds having an average of at least one epoxy group per molecule. Although monoepoxides can be utilized, it is presently preferred that the epoxy materials contain more than one epoxy group per molecule.

The epoxy materials can be essentially any of the epoxides known to those skilled in the art. However, a class of polyepoxides which are particularly useful include polyglycidyl ethers of polyphenols such as bisphenol A. These can be produced, for example, by etherification of a polyphenol with epichlorohydrin in the presence of an alkali. Examples of the phenolic compound which can be used include: bis(4-hydroxyphenyl)2,2-propane, 4,4'-dihydroxy benzophenone, bis(4-hydroxyphenyl)1,1-ethane, nonyl phenol, resorcinol, catechol, bis(4-hydroxyphenyl)1,1-isobutane, bis(4-hydroxy tertiarybutyl phenyl)2,2-propane, bis(2-hydroxynaphthyl) methane, and 1,5-dihydroxynaphthylene.

In many instances, it is preferable to use polyepoxides which have somewhat higher molecular weights and contain aromatic groups. Such polyepoxides can be made by reacting the diglycidyl ether set forth above with a polyphenol such as bisphenol A. Preferably, the polyglycidyl ether of a polyphenol contains free hydroxyl groups in addition to epoxide groups. While the polyglycidyl ethers of polyphenols may be employed, per se, it is frequently desirable to react a portion of the reactive sites (hydroxyl or in some instances epoxy) with a modifying material to vary the film characteristics of the resin.

Another useful class of polyepoxides are produced similarly from novolac resins or similar polyphenol resins. Also suitable are the similar polyglycidyl ethers of polyhydric alcohols which may be derived from polyhydric alcohols such as: ethylene glycol, diethylene glycol, triethylene glycol, 1,2-propylene glycol, 1,4-propylene glycol, 1,5-pentanediol, 1,2,6-hexanetriol, glycerol, and bis(4-hydroxycyclohexyl)2,2-propane.

Polyglycidyl esters of polycarboxylic acids can also be used. These are produced by the reaction of epichlorohydrin or similar epoxy compounds with an aliphatic or aromatic polycarboxylic acid such as: oxalic acid, succinic acid, glutaric acid, terephthalic acid, 2,6-naphthylene dicarboxylic acid, dimerized linolenic acid and the like. Examples include: glycidyl adipate and glycidyl phthalate. Also useful are polyepoxides derived from the epoxidation of an olefinically unsaturated alicyclic compound. Also included are diepoxides comprising in part one or more monoepoxides. These polyepoxides are non-phenolic and are obtained by the epoxidation of alicyclic olefins (e.g., by oxygen and selected metal catalysts), by perbenzoic acids, by acetaldehyde monoperacetate, or by peracetic acid. Examples of such polyepoxides are the epoxy alicyclic ethers and esters.

Other epoxy-containing compounds and resins include nitrogeneous diepoxides such as those disclosed in U.S. Pat. No. 3,365,471; epoxy resins from 1,1-methylene bis(5-substituted hydantoin) such as those disclosed in U.S. Pat. No. 3,391,097; bisimide-containing diepoxides such as those disclosed in U.S. Pat. No. 3,450,711; epoxylated aminoethyldiphenyl oxides such as those disclosed in U.S. Pat. No. 3,312,644; heterocyclic N,N'-diglycidyl compounds such as those disclosed in U.S. Pat. No. 3,503,979;

amine epoxy phosphonates such as those disclosed in British Patent 1,172,916; and 1,3,5-triglycidyl isocyanurates, as well as other epoxy-containing materials known in the art.

The epoxy equivalent weight of the epoxy material (grams of solid resin per equivalent of epoxy) will typically range from between 100 to 5,000. Preferably, the equivalent weight of the epoxy material ranges from between 200 to 1,000.

The amines useful in preparing the polyepoxide amine adduct can be ammonia, primary, secondary and tertiary amines and/or a mixture thereof. Examples of useful amines include: dibutylamine, methyl ethanolamine, dimethylamine, diethanolamine, and the diketimine of diethylene triamine, polyoxyalkylene polyamine (e.g., JEFFAMINES® from Texaco Co.), diethylamine, morpholine, dimethylamine, propylamine, diisopropanol-amine, butylamine, ethylamine, triethylamine, triethanolamine, dimethylethanolamine and the like and/or a mixture thereof (e.g., dibutylamine and methylethanolamine).

The epoxy-amine adduct can be at least partially neutralized with an acid to form a polymeric product containing amine salt and/or quaternary ammonium salt groups. For example, U.S. Pat. No. 4,260,720, column 5, line 20, to column 7, line 4, the portions of which are hereby incorporated by reference, discloses polyepoxide amine adducts and methods of preparing the same.

With regard to the amount of organic amine and polyepoxide which are reacted with one another, the relative amounts depend upon the extent of cationic base, such as cationic salt group formation, desired. This, in turn, will depend upon the molecular weight of the polymer. The extent of cationic salt group formation and the molecular weight of the reaction product should be selected such that, when the resultant cationic polymer is mixed with aqueous medium, a stable dispersion will form. A stable dispersion is one which does not settle or is one which is easily dispersible if some sedimentation occurs. The dispersion should additionally be of sufficient cationic character that the dispersed polymer particles will migrate towards the cathode when an electrical potential is impressed between an anode and a cathode immersed in the aqueous dispersion.

The molecular weight, structure and extent of cationic salt group formation should be controlled such that the dispersed polymer will have the required flow to form a continuous film on the electrode and, in the case of cationic electrodeposition, to form a continuous film on the cathode. The film should be insensitive to moisture to the extent that it will not appreciably redissolve in the electrodeposition bath or be easily rinsed away by an aqueous solution from the coated surface after removal from the bath. On the other hand, the molecular weight, structure and extent of cationic salt group formation should also be controlled such that the deposited and dehydrated film will be dissolvable in aqueous acids during development of the photoresist film.

The amines, including aromatic amines in the presence of certain photoinitiators, are realized to be "co-initiators" of photopolymerization. Hence, the amine employed herein, as to type and/or amount, can have an appreciable effect on the photosensitivity and/or developability of these negative-acting photoresist compositions.

Without being bound by any particular theory, it is believed that the amines as aforestated increase the number of potential crosslinkable sites in this particular class of negative-acting photoresist compositions which are capable of participating in the insolubilization reaction. Differently put, the concentration of the reactive sites in these negative-acting photoresist compositions is thereby increased. Thus, these negative-acting photoresist compositions can be more readily insolubilized with a relatively small but effective content of unsaturated groups. Epoxy-amine adducts, and preferably epoxy polymers containing an aromatic group (e.g., aromatic epoxy-amine adducts), are believed to be particularly effective in improving photosensitivity of these negative-acting photoresist compositions.

In general, most of the cationic polymers (e.g., the epoxy-amine adducts useful in the practice of the invention) will typically have weight average molecular weights ranging of between about 1,000 to about 500,000, and will typically contain from between about 0.1 to about 2, and preferably from between about 0.2 to about 1.0 milliequivalents of a basic group (e.g., cationic group) per gram of resin solids. Given the teachings herein, one can couple the molecular weight with the cationic group content to arrive at a satisfactory polymer. The epoxy equivalent weight can range from between about 100 to about 5,000, and preferably from between about 200 to about 1,000. The cationic groups can alternately be introduced into the polyepoxide by reacting into the epoxy groups with a sulfide or phosphine and an acid, thus forming cationic sulfonium or phosphonium groups. Cationic resins that contain both sulfonium and amine salt groups can also be made as described in U.S. Pat. No. 3,935,087 which is hereby incorporated by reference.

An unsaturated moiety can be introduced into the cationic polymeric material or a precursor thereof. The resultant unsaturated cationic polymeric material contains on the average at least one ethylenically unsaturated moiety per molecule. Preferably, the unsaturated moiety is derived from the partial reaction of isophorone diisocyanate with an active hydrogen containing ethylenically unsaturated compound such as 2-hydroxyethyl acrylate. The resultant product can be described as a partially capped or partially blocked isocyanate. The partially capped isocyanate is then reacted with the aforedescribed polyepoxide adduct.

In addition to isophorone diisocyanate and the hydroxyethyl acrylate, other polyisocyanates can be used to produce the half-capped isocyanates containing an unsaturated moiety. Examples of such other polyisocyanates include those described earlier which can be used to prepare polyurethanes.

Moreover, the polyisocyanates can be prepolymers derived from polyols such as polyether polyols or polyester polyols, including polyols which are reacted with excess polyisocyanates, such as mentioned above, to form isocyanate-terminated prepolymers. Examples of the suitable isocyanate prepolymers include those which are described in U.S. Pat. No. 3,799,854, column 2, lines 22 to 53. These prepolymers are incorporated herein by reference.

Examples of other compounds from which the unsaturated moiety can be derived include: hydroxypropyl acrylate, hydroxyethyl methacrylate, t-butylamino ethyl methacrylate, N-methylolacrylamide, caprolactone, acrylic acid adducts, meta isopropenyl a,a-dimethylisocyanate and mixtures thereof. The resultant unsaturated polymeric material has pendant unsaturation. By "pendant" is meant unsaturation which is attached to the polymer by means of a covalent or ionic bond.

The useful unsaturated ionic polymeric materials, which are typically amine-functional polymeric materials with pendant unsaturation, generally have weight average molecular weights ranging from between about 1,500 to about 1,000,000, and preferably from between about 2,000 to about 500,000. Moreover, unsaturation equivalent (i.e., grams of solid resin/equivalents of unsaturation) of the amine-functional polymeric material generally range from between about 750 to about 1,000,000, and preferably from between about 1,000 to about 50,000.

Typically, the glass transition temperature ($T_g$) of the unsaturated ionic polymeric material ranges from between about $-20°$ C. to about $130°$ C., and preferably from between about $10°$ C. to about $80°$ C. Milliequivalents of the basic group typically range from between about 0.1 to about 5.0, and preferably from between about 0.2 to about 1.0 per gram of resin solids.

The amine-functional polymeric material is at least partially neutralized with an acid, preferably in the presence of water. Examples of such acids include those described earlier which neutralize amine-functional polymeric materials used in the preparation of positive-acting photoresists.

As stated above, a nonionic unsaturated material is employed in combination with the aforedescribed unsaturated polymeric ionic material. Typically the nonionic unsaturated materials are blended with the unsaturated ionic materials prior to dispersion in water. The nonionic unsaturated material can be mono or multi functional unsaturated materials. Examples of such materials include: a diacrylate of a polyepoxide, an acrylate ester of an ethoxylated or propoxylated polyphenol, an acrylate ester of trimethylolpropane or pentaerythritol and mixtures thereof.

Amounts of the nonionic unsaturated material which can be used typically rang from between about 1 to about 70 weight percent, and preferably from between about 5 to about 40 weight percent. These weight percentages are based upon the weight of the total resin solids in the bath.

Unsaturation equivalent weight of these nonionic materials are typically greater than 90. In many instances, the unsaturation equivalent weight of these nonionic materials range from between 90 to 1000. Examples of the unsaturated nonionic materials include: epoxy acrylates, urethane acrylates, ether acrylates, ester acrylates and ethylenically unsaturated resin such as acrylated melamine resins and acrylated acrylic resins.

Preferably, the nonionic unsaturated materials contain at least two unsaturated groups per molecule. Examples of the preferred nonionic materials include: a diacrylate of a diglycidyl ether of bisphenol A, trimethylol-propane triacrylate, pentaerythritol triacrylate, a diacrylate ester of ethoxylated diphenol and/or mixtures thereof.

The percent of equivalents of unsaturation derived from the cationic material is typically from between about 5 to about 80 percent, and preferably from between about 10 to about 50 percent of the total unsaturation equivalents of the photoresist composition. The percent of equivalents of unsaturation derived from the nonionic material is typically from between about 95 to about 20 percent, and preferably, from between about 90 to about 50 percent.

The photoinitiator employed in the preparation of negative-acting photoresists which can be used when practicing this invention can be either incorporated into the photoresist's backbone or blended with the photoresist as a separate component. These photoinitiators initiate polymerization of the unsaturated groups of the photoresist when the photoresist is exposed to actinic radiation. Examples of photoinitiators which can be used in the preparation of negative-acting photoresists include: thioxanthones, phosphine oxides, quinones, benzophenones, benzoin, acetophenones, benzoin ethers, and benzil ketals. Examples of photoinitiators which are presently preferred include: isopropyl thioxanthone, 1-chloro thioxanthone (or other thioxanthane derivatives), Benzoin ethers (e.g., IRGA-CURE® 907 from Ciba Geigy Co.), and combinations thereof.

The photoinitiator is typically employed in an amount ranging from between about 0.05 to about 25 weight percent, and preferably, from between about 0.5 to about 20 weight percent. These weight percentages are based upon the weight of the total resin solids.

The process of making a negative-acting electrodepositable photoresist is known. One particular example of such a process is described in copending U.S. application Ser. No. 08/268,778, entitled "Photoimageable Electrodepositable Photoresist Composition" and filed Jun. 30, 1994.

The microgel-containing positive or negative-acting electordepositable photoresists made in accordance with the present invention can optionally include other components. For example, since film-smoothness is often very derivable, additives which decrease surface defects by affecting surface tension and flow of the coating (e.g., crater control agents, pinhole control additives, coalescing solvents) can be employed.

The resin solids content of the electrodepositable photoresist compositions prepared in accordance with the present invention will typically range from between about 1 to about 50 percent, preferably from between 3 to 40 percent, and more preferably from between 5 to 30 percent. Moreover, the pH of these compositions typically range from between about 2 to about 11, preferably, from between about 2 to about 10, and more preferably, from between about 3 to about 9. The conductivity of these photoresist compositions typically range from between about 50 to about 4,000 micromhos per centimeter, preferably from between about 100 to about 3,000, and more preferably, from between about 200 to about 2,000.

One method of electrodepositing a photoresist prepared in accordance with the present invention includes placing the aqueous dispersion of the photoresist composition in contact with an electrically-conductive anode and an electrically-conductive cathode. The surface to be coated can be made the cathode or the anode. Conversely, in the case of anionic electrodeposition, the surface to be coated is the anode. When a sufficient voltage is impressed between the electrodes, an adherent film of the coating composition is deposited onto the electrode being coated following contact with the aqueous dispersion.

Conditions under which electrodeposition can be carried out is as follows. The applied voltage may be varied and can be, for example, as low as one volt or as high as several thousand volts. Typically however, the applied voltage will range from between about 10 to about 400 volts. On the other hand, current density will typically range from between about 1 to about 10 amperes per square foot and will tend to decrease during electrodeposition indicating the formation of an insulating film. Electrodeposition time typically varies from between about 5 to about 200 seconds.

The resulting electrodeposited film typically has a thickness ranging from between about 0.2 to about 130 microns. In most instances, however, film thicknesses will range from between about 2 to about 80 microns. Generally, the electrodeposited film is dehydrated by an infrared bake, a short oven bake, or an air blow-off.

In the process for preparing the patterned photoresist in accordance with the present invention, a photomask is typically placed on the dehydrated photoresist. The masked photoresist is then exposed to actinic radiation.

In accordance with this invention, the dehydrated photoresist can be directly covered with a photomask to make an intimate contact therewith. The photomask (or tool) is a film on which is printed a pattern which is the negative (or positive) image of the desired circuit. Actinic radiation is shown through the regions of the photoresist film which are transparent to said radiation in order to transfer the image of the photomask onto the photoresist film.

The light exposure dosage needed to solubilize or insolubilize an electrodeposited, microgel-containing photoresist made in accordance with the present invention is typically less than about 800 mJ/cm$^2$, when the dehydrated film is less than or equal to 3 microns and when the exposed film is washed with a developing solution. Preferably, the light exposure dosage needed under these conditions is less than about 500 mJ/cm$^2$. Irradiation can be conducted with ultraviolet (UV) light produced by various lamps having an average emission wavelength ranging from about 200 to about 700 nanometers (nm). Generally, the conditions for irradiation will depend on the nature of the source of irradiation, film thickness and the like.

After irradiation and removal of the photomask, the photoresist film is developed. Development of the photoresist film entails subjecting it to a developing solution by spraying, dipping, or the like. The developing solution for positive-acting and negative-acting photoresists is usually an acidic aqueous solution for cationic photoresists and a basic aqueous solution for anionic photoresists.

Usually, the photoresist film may be developed at a temperature which ranges from between about 0° C. to about 125° C. over a period which ranges from between about 10 seconds to about 10 minutes. With negative-acting photoresists, the exposed areas become insolubilized. However, the opposite is true for positive-acting photoresists. Hence, there is a solubility differential between the exposed and unexposed areas of the photoresist film, and the developing solution removes one or the other.

The term solubility differential denotes the rate of removal, by a developing solution, of a photoresist film which has been exposed to actinic radiation. For example, with regard to negative-acting photoresists, the removal of the film by the developing solution is slower in the exposed areas relative to the unexposed areas. Accordingly, for a negative-acting photoresist, the unexposed areas of the film are the first to be removed. On the other hand, with regard to positive-acting photoresists, the removal of the film by the developing solution is slower in the unexposed areas relative to the exposed areas. Accordingly, for a positive-acting photoresist, the exposed areas of the film are the first to be removed.

The etching process involves the removal of the conductive substrate that is not covered with the photoresist film after the developing process. Etching is conducted by subjecting the uncovered substrate to an etchant which is designed to attack the exposed conductive material (e.g., copper) but not significantly attack the photoresist. Typically, etchants comprise ferric chloride solutions, cupric chloride, alkaline ammoniacal etchants or peroxide.

The etchant is usually sprayed onto the developed surfaces. Moreover, the etchant is usually maintained at a temperature which ranges from between about 0° C. to about 75° C. and is permitted to remain on the surface of the substrate for a sufficient time (i.e., from about 1 to about 20 minutes) to dissolve the exposed conductive material. Films derived from these compositions, in general, will resist attack by the various etchants used in the industry, (e.g. ammoniacal etchants, $CuCl_2$, $FeCl_3$, and a peroxide:acid mixture).

After the etching process is completed, a stripping means is employed to remove the remaining photoresist film from the substrate. The particular stripping solutions employed will depend upon the chemical composition of the photoresist. Stripping solutions for photoresist made from cationic polymers comprise aqueous acids. Stripping solutions for photoresists made from anionic polymers comprise aqueous bases.

The examples which follow are intended to assist in a further understanding of this invention. Particular materials employed, species and conditions are intended to be illustrative of the invention.

EXAMPLES

The following examples show the preparation of electrodepositable photoresist compositions with improved edge coverage. Specifically, a microgel-containing cationic electrodepositable positive-acting photoresist was prepared and compared to a similar photoresist containing no microgel for edge coverage, photosensitivity and developability.

Example A

Preparation of Epoxy Microgel

This example shows the preparation of an ungelled cationic soap based on aromatic epoxy resin used in the synthesis of two microgel examples shown below. The cationic soap was prepared from the following mixture of ingredients:

| Ingredients | Parts by Weight |
| --- | --- |
| EPON828[1] | 1023.0 |
| Bisphenol A-ethylene oxide adduct (1/6 molar ratio) | 365.0 |
| Bisphenol A | 297.0 |
| Methyl isobutyl ketone | 88.7 |
| Benzyldimethylamine | 1.4 |
| Benzyldimethylamine | 4.2 |
| Diketimine[2] | 179.4 |
| N-methylethanolamine | 85.2 |
| Lactic acid (88% aqueous) | 222.7 |
| Deionized water | 1293.0 |
| Deionized water | 3097.6 |

[1]Diglycidyl ether of bisphenol A having an epoxy equivalent weight of 188, commercially available from the Shell Chemical Co.
[2]Diketimine derived from diethylenetriamine and methyl isobutyl ketone (73 percent solids in methyl isobutyl ketone).

The EPON 828, bisphenol A-ethylene oxide adduct, bisphenol A and methyl isobutyl ketone were charged into a reaction vessel and heated under a nitrogen atmosphere to 140° C. The first portion of the benzyldimethylamine was added and the reaction mixture allowed to exotherm to about 185° C. and refluxed to remove azeotropically any water present. The reaction mixture was cooled to 160° C., held for one-half hour, cooled further to 145° C. and the second portion of benzyldimethylamine added. The reaction was held at 145° C. until a reduced Gardner-Holdt viscosity (50 percent resin solids in 2-methoxypropanol) of O-P was obtained. At this point, the reaction mixture was cooled to 125° C. and the diketimine and N-methylethanolamine were added in succession. The mixture was allowed to exotherm to 140° C. and then cooled to 125° C. and held there for one hour. At the end of an hour hold, the resin was dispersed in an aqueous medium consisting of the lactic aid and the first portion of deionized water. The dispersion was then further thinned with the second portion of deionized water to give a cationic epoxy soap having a solids content of 31 percent and particle size of less than 300 Angstroms.

This example shows the synthesis of a cationic microgel from the cationic epoxy soap described above. The cationic microgel was prepared from the following ingredients:

| Ingredients | Parts by Weight |
| --- | --- |
| Cationic Epoxy soap | 2258.1 |
| Deionized water | 1510.8 |
| EPON 828 | 71.7 |
| Methyl isobutyl ketone | 17.9 |
| Deionized water | 598.7 |

The cationic epoxy soap and the first portion of deionized water were charged to a reaction vessel and stirred under nitrogen for at least 5 minutes to accomplish mixing. The EPON 828 as a solution is the methyl isobutyl ketone was then added to the vessel with continued stirring and the resulting mixture heated to 90° C. and held there for 3 hours. At the end of the hold, the reaction mixture was diluted with the second portion of deionize water and vacuum stripped while cooling to 60° C. Stripping was continued at this temperature until a total of 170 parts of distillate was collected. The resulting mixture was then cooled to room temperature to give a cationic microgel with a solids content of 18 percent and a particle size of 50 Angstroms.

Example B

Preparation of Electrodepositable Positive Acting Photoresist Dispersion with Microgel for Edge Coverage In this example, 484.12 parts of m-TMXDI diisocyanate (meta-tetramethylxyl diisocyanate supplied by Cytec) was added dropwise to a 60° C. solution of 22.82 parts of 2,6-dinitro-1,4-dimethanol, 24.42 parts of ethoxylated bisphenol A (3 ethoxylates per hydroxyl), and 0.2 parts of dibutyltin dilaurate in 70 parts of methyl isobutyl ketone. The batch was held at 60° C. for 1.5 hours. Thereafter 4.01 parts of tridecyl alcohol, was added. The mixture was held at 60° C. until the isocyanate was completely consumed as determined by infrared spectroscopy.

A solution of 14.90 parts of N-methyldiethanolamine and 24.42 parts of ethoxylated bisphenol A (3 ethoxylates per phenol), was added to the reaction mixture. Thereafter, 45.19 parts of m-TMXDI was added dropwise and the reaction was held at 60° C. for 1 hour. Then 4.01 parts of tridecyl alcohol was added and the reaction was held at 60° C. until the isocyanate reacted completely.

The resin was cooled to 40° C. and 7.91 parts of lactic acid was added to the reaction mixture. This was followed by addition of 173.87 parts (18.2% solids) of the cationic epoxy microgel dispersion from EXAMPLE A under high shear conditions. Next, 1667.85 parts of deionized water was fed into the rapidly stirred resin to form a dispersion. The methylisobutylketone was then azeotropically removed by vacuum distillation. This was followed by the addition of a sufficient amount of deionized water so as to form an aqueous dispersion with a final solids of 10.3%. The photoresist dispersion (1808.8 parts) was combined with 1403.4 parts of deionized water, 18.6 parts of Halcomid M 8-10™ dimethylamide (supplied by C. P. Hall Company) and 0.6 parts of SILWET® L-7602™ surfactant. These components were then stirred together until a homogeneous mixture was formed.

Example C

Preparation of Electrodepositable Positive Acting Photoresist Dispersion without Microgel A resin was prepared exactly as in EXAMPLE B above except the epoxy microgel was not incorporated into the polymer dispersion. The final solids of the resin was 10.2%. The dispersion (1521.7 parts) was combined with 1582.6 parts of deionized water, 3.1 parts of Halcomid M 8-10™ dimethylamide, and 0.5 parts of SILWET® L-7602™ surfactant. This mixture was stirred overnight.

Example D

Edge Coverage Experiments

In these tests, a two-sided copper clad board, with a consistent plated hole pattern, was electrocoated according to the conditions shown in the table below. The fleshy coated test boards were baked for 3 minutes at 145° C. Each test panel was attached to an electrode on a WACO Enamelrater and immersed into a 1% NaCl solution attached to another electrode. A 6.3 voltage source was applied to the circuit for approximately 4 seconds and the amperage draw through the coating was recorded. Lower amperage readings signify better edge coverage properties. Ideally, the amperage reading should be as close to zero as possible. Accordingly, amperage readings were used as a quantitative measurement of edge coverage.

For each of the test panels, the edges were taped to avoid panel edge effects. Also, a small spot of coating was removed from the top of each panel so as to allow for good contact with the electrode. The exposed copper area at the top of each test panel was not immersed into the salt solution. The results observed after performing the edge coverage tests are listed in the table below:

TABLE 1

| Resin | Coatout Voltage (volts) | Bath Temperature (°C.) | Coatout Time (sec) | Film Thickness (mil) | Enamelrater Result (milliamperes) |
| --- | --- | --- | --- | --- | --- |
| EXAMPLE B: (With Microgel) | 140 | 38 | 90 | 0.28 | 10.1 |
| EXAMPLE C: (Without Microgel) | 80 | 38 | 90 | 0.25 | 310.4 |

As can be seen from Table 1, the Enamelrater readings demonstrate that edge coverage significantly improves with the incorporation of the epoxy microgel. Microscopic inspection of boards coated with EXAMPLE B, following etching in a ferric chloride etching bath for 5 minutes at 52° C., showed the edges of the holes to be protected from etching. However, boards coated with EXAMPLE C, etched in the same ferric chloride bath and under the same conditions, showed severe attack of the edges of the holes by the etching bath.

In addition to the above, this example demonstrates that it was possible to electrodeposit the microgel containing positive photoresist onto copper foil clad laminate samples. These samples were obtained from Nelco Co. The electrobath bath temperature was 38° C. and 160 volts was applied for 90 seconds.

Following the dehydration bake of 3 minutes at 145° C., a dry film thickness of 0.30 mil was obtained. The photoresist was exposed to UV light through a phototool to 424 mJ/cm$^2$ exposure dosage on a Kepro exposure unit. The photoresist was than immersed into an aqueous acid developer at 95° F. for 45 seconds to generate a pattern in which the photoexposed areas of photoresist are completely removed to copper and the unexposed areas remain completely intact.

It is evident from the foregoing that various modifications, which are apparent to those skilled in the art, can be made to the embodiments of this invention without departing from the spirit or scope thereof. Having thus described the invention, it is claimed as follows.

That which is claimed is:

1. An electrodepositable, photoimageable positive-acting resist composition comprising:
   (a) an electrodepositable positive-acting photosensitive composition, and
   (b) a microgel, wherein the microgel comprises a plurality of crosslinked organic particles which can form a stable aqueous dispersion, and wherein the microgel is present in an amount ranging from between about 0.1 to about 30 weight percent, said weight percentages being based upon the total weight of the resin solids in the resist composition.

2. A photoimageable resist composition as recited in claim 1 wherein the positive-acting photoresist is anionic.

3. A photoimageable resist composition as recited in claim 1 wherein the positive-acting photoresist is cationic.

4. A photoimageable resist composition as recited in claim 3 wherein the positive-acting photoresist comprises a water dispersible mixture of a cationic polymeric material and a photoreactive polymeric material.

5. An electrodepositable, photoimageable cationic, positive-acting resist composition comprising a water-dispersible mixture of a cationic polymeric material and a photoreactive polymeric material, wherein the water-dispersible cationic polymeric material is an epoxy-amine adduct with pendant urethane groups, and wherein the photoreactive polymeric material comprises:
   (a) an electrodepositable positive-acting photosensitive composition, and
   (b) a microgel, wherein the microgel comprises a plurality of cross-linked organic particles which conform a stable aqueous dispersion, and wherein the microgel is present in an amount ranging from between about 0.1 to about 30 weight percent, said weight percentages being based on the total weight of the resin solids in the resist composition.

6. A photoimageable resist composition as recited in claim 1 wherein the microgel's organic particles are stabilized as an aqueous dispersion by virtue of anionic or cationic groups thereon.

7. A photoimageable resist composition as recited in claim 1 wherein the microgel component comprises a cationic polyepoxide-amine reaction product.

* * * * *